(12) United States Patent
Matsudera

(10) Patent No.: US 8,384,441 B2
(45) Date of Patent: Feb. 26, 2013

(54) SEMICONDUCTOR INTEGRATED CIRCUIT HAVING A SQUELCH CIRCUIT

(75) Inventor: Katsuki Matsudera, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 13/009,032

(22) Filed: Jan. 19, 2011

(65) Prior Publication Data

US 2011/0181321 A1 Jul. 28, 2011

(30) Foreign Application Priority Data

Jan. 26, 2010 (JP) .................................. 2010-14406

(51) Int. Cl.
*H03K 5/22* (2006.01)
(52) U.S. Cl. .......................................... 327/65; 327/63
(58) Field of Classification Search .................... 327/63, 327/65
See application file for complete search history.

(56) References Cited

U.S. PATENT DOCUMENTS

| 5,392,043 | A * | 2/1995 | Ribner | 341/143 |
| 7,136,006 | B2 * | 11/2006 | Koh et al. | 341/172 |
| 7,199,743 | B2 * | 4/2007 | Casper et al. | 341/150 |
| 2005/0219105 | A1 * | 10/2005 | Liu et al. | 341/155 |
| 2008/0238491 | A1 * | 10/2008 | Aizawa | 327/65 |
| 2008/0278227 | A1 * | 11/2008 | Liu | 327/551 |

FOREIGN PATENT DOCUMENTS

| JP | 2009-141722 | 6/2009 |
| JP | 2010-045737 | 2/2010 |

* cited by examiner

*Primary Examiner* — Ryan Jager
(74) *Attorney, Agent, or Firm* — Turocy & Watson, LLP

(57) ABSTRACT

A semiconductor integrated circuit has a squelch circuit which has a first noninverting input terminal and a first inverting input terminal, which compares differential amplitude between a signal which is input to the first noninverting input terminal and a signal which is input to the first inverting input terminal with a preset threshold, and which outputs a signal depending upon a result of the comparison. The semiconductor integrated circuit has a first switch circuit between a first reception terminal and the first noninverting input terminal. The semiconductor integrated circuit has a second switch circuit between a second reception terminal and the first inverting input terminal. The semiconductor integrated circuit has a third switch circuit between the first reception terminal and the first inverting input terminal. The semiconductor integrated circuit has a fourth switch circuit between the second reception terminal and the first noninverting input terminal.

7 Claims, 8 Drawing Sheets

SEMICONDUCTOR INTEGRATED CIRCUIT HAVING A SQUELCH CIRCUIT

CROSS-REFERENCE TO RELATED APPLICATION

This application is based upon and claims the benefit of priority from the prior Japanese Patent Application No. 2010-14406, filed on Jan. 26, 2010, the entire contents of which are incorporated herein by reference.

BACKGROUND

1. Field

Embodiments described herein relate generally to a semiconductor integrated circuit including a squelch circuit.

2. Background Art

For example, according to serial STA (SATA: Serial Advanced Technology Attachment) which is communication standards between a computer host and a device, either the host or the device transmits a specific pattern (OOB pattern) to the opposite side, when the host and the device return from a power management state with power dissipation reduced or resetting is conducted.

And the receiving side needs to recognize that the sent pattern signal is the OOB pattern signal. A squelch circuit provided in a semiconductor integrated circuit on the receiving side detects the OOB pattern signal by detecting a burst interval and a space interval of the sent pattern signal.

Furthermore, in PCIexpress, the receiving side detects whether the TX side is conducting data transfer (there is a difference signal) or is not conducting the data transfer (there isn't a difference signal).

For testing this squelch circuit, there are high speed testers using a signal of at least several hundred mega bps, low speed testers using a DC (direct current) voltage, and the like.

For example, a test at an actual transfer rate using the high speed tester is expensive, and there is a problem in cost.

In the DC test using the low speed tester, a high precision small amplitude AC (alternating current) signal cannot be input, and consequently it is necessary to use correlation between the DC test and a speed test. If the low speed tester is used, therefore, it is necessary to widen test specifications considering the error of the correlation, resulting in a problem of a lowered yield of the product.

A conventional semiconductor integrated circuit includes a squelch circuit (amplitude determination circuit) and a DC amplitude generation circuit which supplies a differential signal of DC voltages to the squelch circuit at the time of testing for adjusting a threshold.

In this conventional semiconductor integrated circuit, stationary DC voltages are applied to the squelch circuit. In other words, the semiconductor integrated circuit is not a circuit to be tested fast by inputting a high speed data pattern signal. In addition, since a DC amplitude generation circuit is additionally installed, a circuit area of the semiconductor integrated circuit increases.

DETAILED DESCRIPTION

A semiconductor integrated circuit has a first reception terminal and a second reception terminal receiving a differential signal. The semiconductor integrated circuit has a squelch circuit which has a first noninverting input terminal and a first inverting input terminal, which compares differential amplitude between a signal which is input to the first noninverting input terminal and a signal which is input to the first inverting input terminal with a preset threshold, and which outputs a signal depending upon a result of the comparison. The semiconductor integrated circuit has a first switch circuit which brings about conduction between the first reception terminal and the first noninverting input terminal when it is switched to an on-state, and which brings about insulation between the first reception terminal and the first noninverting input terminal when it is switched to an off-state. The semiconductor integrated circuit has a second switch circuit which brings about conduction between the second reception terminal and the first inverting input terminal when it is switched to an on-state, and which brings about insulation between the second reception terminal and the first inverting input terminal when it is switched to an off-state. The semiconductor integrated circuit has a third switch circuit which brings about conduction between the first reception terminal and the first inverting input terminal when it is switched to an on-state, and which brings about insulation between the first reception terminal and the first inverting input terminal when it is switched to an off-state. The semiconductor integrated circuit has a fourth switch circuit which brings about conduction between the second reception terminal and the first noninverting input terminal when it is switched to an on-state, and which brings about insulation between the second reception terminal and the first noninverting input terminal when it is switched to an off-state.

Hereafter, embodiments of a semiconductor integrated circuit according to the present invention will be described more specifically with reference to the drawings.

(First Embodiment)

Figure 1:
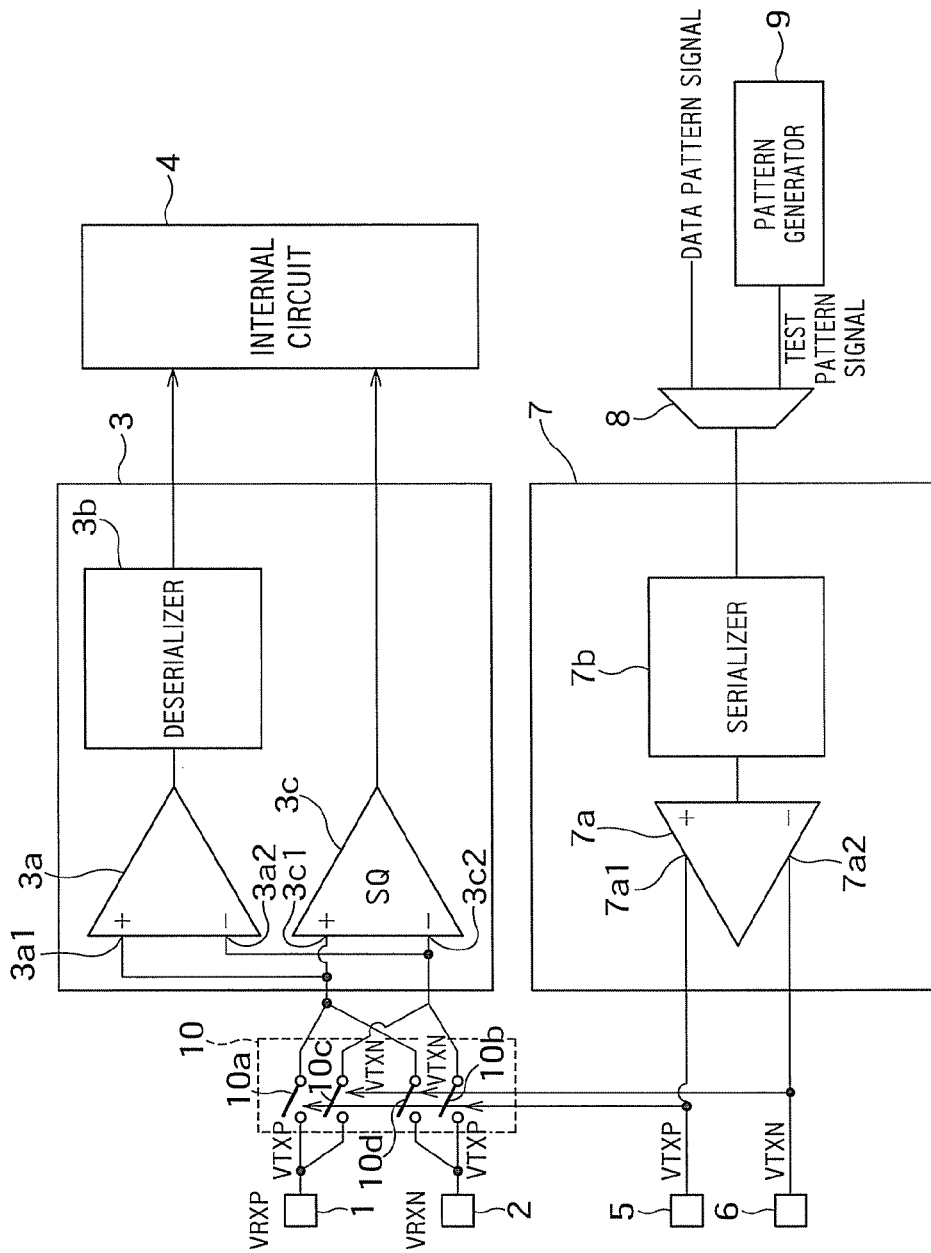
FIG. 1 is a diagram showing an example of a configuration of a semiconductor integrated circuit 100 according to a first embodiment which is an aspect of the present invention.

FIG. 1 is a diagram showing an example of a configuration of a semiconductor integrated circuit 100 according to a first embodiment which is an aspect of the present invention.

As shown in FIG. 1, the semiconductor integrated circuit 100 includes a first reception terminal 1, a second reception terminal 2, a reception circuit 3, an internal circuit 4, a first transmission terminal 5, a second transmission terminal 6, a transmission circuit 7, a multiplexer 8, a pattern generator 9, and a switch device 10.

The reception circuit 3 is, for example, a reception line (RX block) of SATA and PCIe, and the first reception terminal 1 and the second reception terminal 2 are input devices to the reception line. The transmission circuit 7 is, for example, a transmission line (TX block) of SATA and PCIe, and the first transmission terminal 5 and the second transmission terminal 6 are output devices from the transmission line.

The first reception terminal 1 is adapted to be supplied with a reception signal VRXP at the time of an ordinary operation. The second reception terminal 2 is adapted to be supplied with a reception signal VRXN which is obtained by inverting the reception signal VRXP in phase at the time of the ordinary operation. In this way, the first reception terminal 1 and the second reception terminal 2 are used to receive a differential signal at the time of the ordinary operation.

By the way, at the time of a test operation, a first DC voltage VRXPDC is applied to the first reception terminal 1, and a second DC voltage VRXNDC which is different from the first DC voltage VRXPDC is applied to the second reception terminal 2.

The first transmission terminal 5 is adapted to output a transmission signal VTXP which is output from the transmission circuit 7. The second transmission terminal 6 is adapted to output a transmission signal VTXN which is output from the transmission circuit 7 and which is inverted in phase as compared with the transmission signal VTXP. In this way, the first transmission terminal 5 and the second transmission terminal 6 are used to output a differential signal.

The internal circuit 4 is adapted to conduct processing on an output signal of the reception circuit 3 and supply a resultant signal to an internal device, not illustrated, which operates on the basis of the reception signal.

The pattern generator 9 is adapted to generate a test pattern signal. The test pattern signal generated by the pattern generator 9 is used to test a squelch circuit 3c. As for the pattern generator 9, however, another conventional pattern generator for testing can be alternatively used. As a result, an increase of a circuit area of the semiconductor integrated circuit 100 can be suppressed.

Furthermore, the test pattern signal is set to various signals according to clock signal and specifications of the squelch circuit 3c.

The test pattern signal and a data pattern signal to be transmitted are input to the multiplexer 8, and the multiplexer 8 is adapted to output either the test pattern signal or the data pattern signal. By the way, the data pattern signal is generated by, for example, the internal circuit 4.

The reception circuit 3 includes a receiver (comparator) 3a, a deserializer 3b, and the squelch circuit 3c.

The squelch circuit 3c includes a first noninverting input terminal 3c1 and a first inverting input terminal 3c2. The squelch circuit 3c is adapted to compare differential amplitude between a signal which is input to the first noninverting input terminal 3c1 and a signal which is input to the first inverting input terminal 3c2 with a preset threshold, and output a signal depending upon a result of the comparison.

The squelch circuit 3c detects amplitude of the signal which is input via the first and second reception terminals 1 and 2 (the first noninverting input terminal 3c1 and the first inverting input terminal 3c2). If the detected amplitude is at least the prescribed threshold, then the squelch circuit 3c outputs, for example, a signal of the "high" level. On the other hand, if the detected amplitude is less than the prescribed threshold, then the squelch circuit 3c outputs, for example, a signal of the "low" level.

For example, the internal circuit 4 can determine whether the differential signal which is input via the first and second reception terminals 1 and 2 is a prescribed signal or noise on the basis of the output signal of the squelch circuit 3c. In this way, the squelch circuit 3c is used to detect whether a valid signal is sent from the transmission side.

The receiver 3a includes a second inverting input terminal 3a2 connected to the first inverting input terminal 3c2 of the squelch circuit 3c and a second noninverting input terminal 3a1 connected to the first noninverting input terminal 3c1 of the squelch circuit 3c. In other words, the second noninverting input terminal 3a1 of the receiver 3a is connected to the first reception terminal 1 via a first switch circuit 10a, and the second inverting input terminal 3a2 of the receiver 3a is connected to the second reception terminal 2 via a second switch circuit 10b.

The receiver 3a is adapted to output a signal depending upon the amplitude of the differential signals VRXP and VRXN which are input respectively to the second noninverting input terminal 3a1 and the second inverting input terminal 3a2.

The deserializer 3b is adapted to conduct serial-parallel conversion on the signal which is output from the receiver 3a, and output a resultant signal to the internal circuit 4.

The transmission circuit 7 includes a driver 7a and a serializer 7b.

The serializer 7b is adapted to conduct parallel-serial conversion on the signal which is output from the multiplexer 8 and output a resultant signal to the driver 7a.

An inverting output terminal 7a1 of the driver 7a is connected to the first transmission terminal 5, and a noninverting output terminal 7a2 of the driver 7a is connected to the second transmission terminal 6. The driver 7a is adapted to output the differential signals VTXP and VTXN on the basis of the signal supplied from the serializer 7b.

In other words, the driver 7a outputs the differential signals VTXP and VTXN respectively to the noninverting output terminal 7a1 and the inverting output terminal 7a2 on the basis of the test pattern signal generated by the pattern generator 9.

The switch device 10 includes a first switch circuit 10a, a second switch circuit 10b, a third switch circuit 10c, and a fourth switch circuit 10d.

The first switch circuit 10a is connected between the first reception terminal 1 and the first noninverting input terminal 3c1. The first switch circuit 10a is adapted to bring about conduction between the first reception terminal 1 and the first noninverting input terminal 3c1 when it is switched to an on-state, and bring about insulation between the first reception terminal 1 and the first noninverting input terminal 3c1 when it is switched to an off-state.

The second switch circuit 10b is connected between the second reception terminal 2 and the first inverting input terminal 3c2. The second switch circuit 10b is adapted to bring about conduction between the second reception terminal 2 and the first inverting input terminal 3c2 when it is switched to the on-state, and bring about insulation between the second reception terminal 2 and the first inverting input terminal 3c2 when it is switched to the off-state.

The third switch circuit 10c is connected between the first reception terminal 1 and the first inverting input terminal 3c2. The third switch circuit 10c is adapted to bring about conduction between the first reception terminal 1 and the first inverting input terminal 3c2 when it is switched to the on-state, and bring about insulation between the first reception terminal 1 and the first inverting input terminal 3c2 when it is switched to the off-state.

The fourth switch circuit 10d is connected between the second reception terminal 2 and the first noninverting input terminal 3c1. The fourth switch circuit 10d is adapted to bring about conduction between the second reception terminal 2 and the first noninverting input terminal 3c1 when it is switched to the on-state, and bring about insulation between the second reception terminal 2 and the first noninverting input terminal 3c1 when it is switched to the off-state.

At the time of test operation, the first and second switch circuits 10a and 10b are controlled to turn on/off on the basis of the first differential signal VTXP which is output from the noninverting output terminal 7a1. At the time of the test operation, the third and fourth switch circuits 10c and 10d are controlled to turn on/off on the basis of the second differential signal VTXN which is output from the inverting output terminal 7a2 and which has a phase inverted as compared with the first differential signal VTXP. In other words, the first to fourth switch circuits 10a to 10d are controlled to turn on/off on the basis of the test pattern signal generated by the pattern generator 9.

In this way, at the time of the test operation, the first switch circuit 10a and the second switch circuit 10b are controlled to be synchronized to each other in on/off (to turn on and off simultaneously). In addition, at the time of the test operation, the third switch circuit 10c and the fourth switch circuit 10d are controlled to be synchronized in on/off and be complementary in on/off (be opposite in on/off) to the first and second switch circuits 10a and 10b.

By the way, at the time of the test operation, a tester is connected to the first and second reception terminals 1 and 2 as described later.

By the way, at the time of ordinary operation in which the differential signal is received from the first and second reception terminals 1 and 2, the first switch circuit 10a and the second switch circuit 10b are turned on and the third switch circuit 10c and the fourth switch circuit 10d are turned off.

Accordingly, at the time of the ordinary operation, the signal which is input to the first reception terminal 1 is input to the noninverting input terminal of the receiver 3a and the noninverting input terminal of the squelch circuit 3c, and the signal which is input to the second reception terminal 2 is input to the inverting input terminal of the receiver 3a and the inverting input terminal of the squelch circuit 3c. In other words, at the time of the ordinary operation, the reception circuit 3 conducts operation similar to that of the conventional reception circuit.

For example, the first switch circuit 10a and the second switch circuit 10b are formed of MOS transistors. At the time of a test operation, the first differential signal VTXP is input to gates of the MOS transistors, and on/off is controlled according to the first differential signal VTXP. For example, the third switch circuit 10c and the fourth switch circuit 10d are formed of MOS transistors. At the time of the test operation, the second differential signal VTXN is input to gates of the MOS transistors, and on/off is controlled according to the second differential signal VTXN.

An example of the test operation of the squelch circuit 3c in the semiconductor integrated circuit 100 having the configuration and function described heretofore will now be described.

Figure 2:
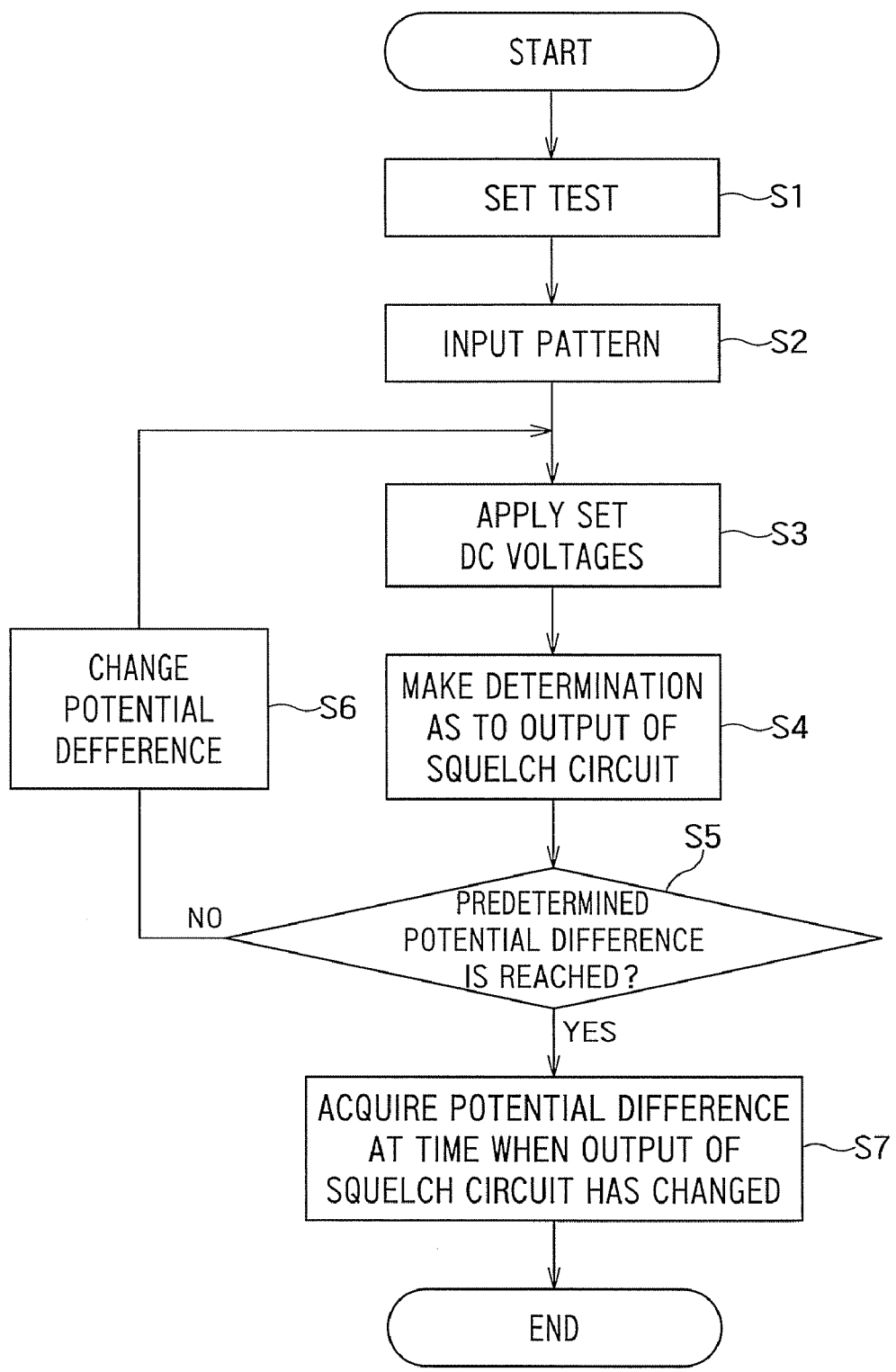
FIG. 2 is a flow chart showing an example of the test operation of the squelch circuit 3c in the semiconductor integrated circuit 100 shown in FIG. 1.
Figure 3:
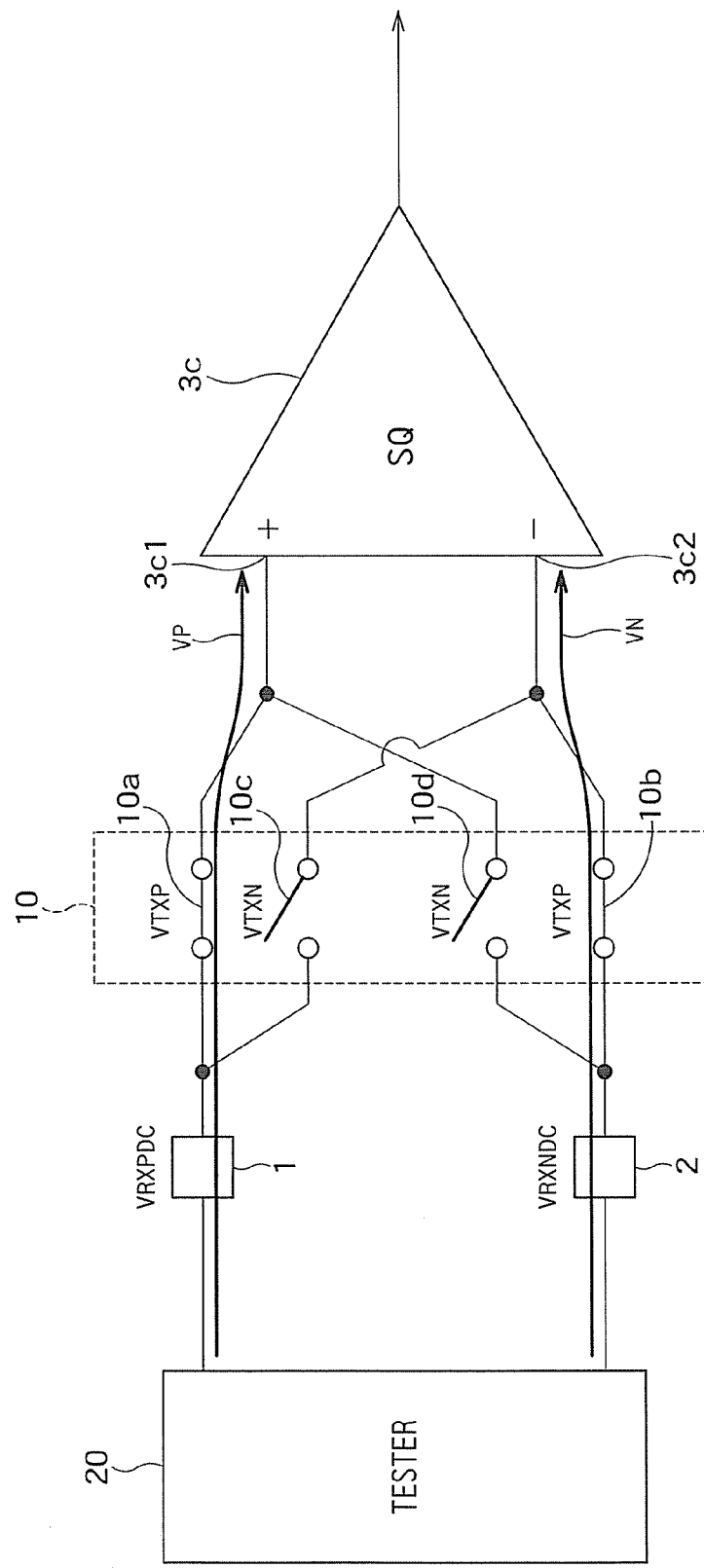
FIG. 3 is a diagram showing a connection relation in the switch device 10 and paths of voltages which are input to the squelch circuit 3c at the time of the test operation of the squelch circuit 3c in the semiconductor integrated circuit 100 shown in FIG. 1.
Figure 4:
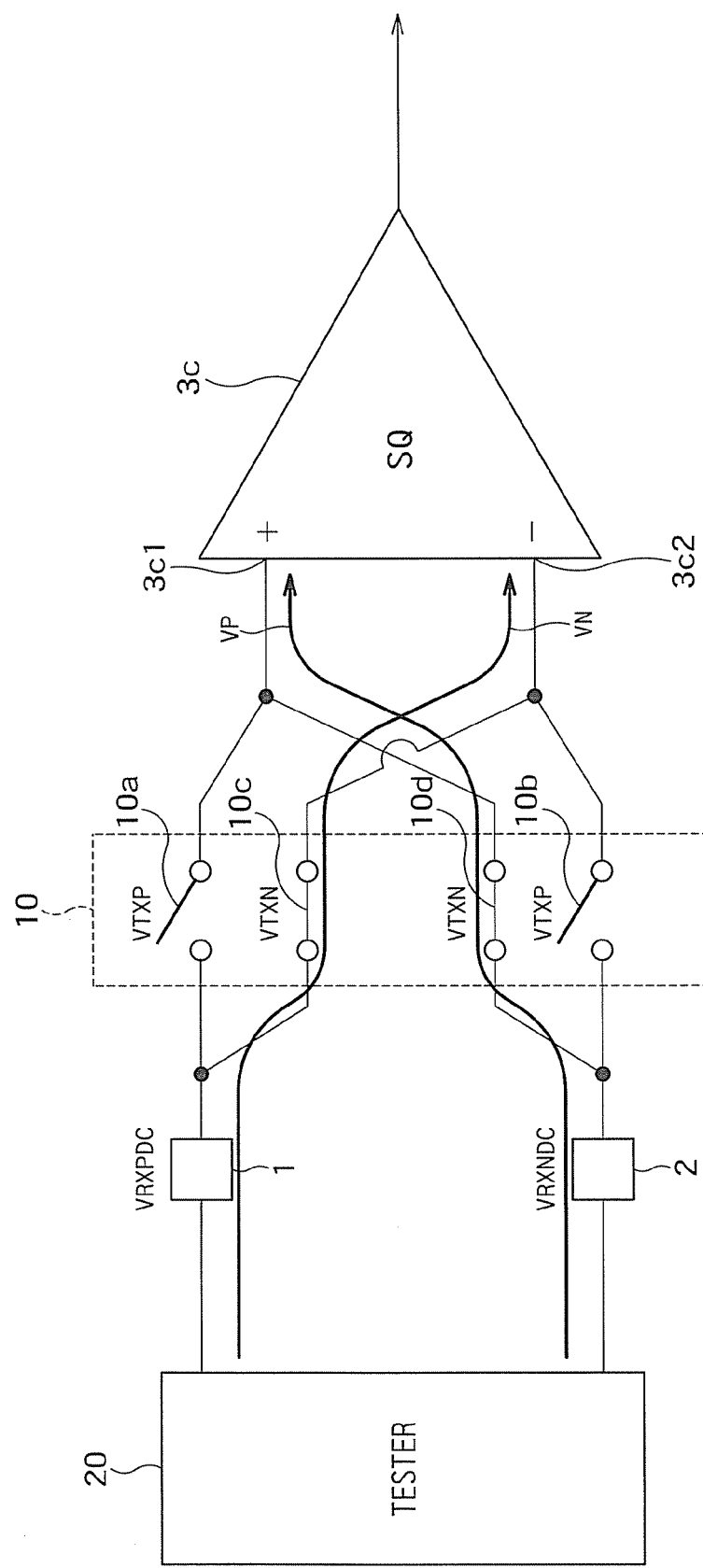
FIG. 4 is a diagram showing a connection relation in the switch device 10 and paths of voltages which are input to the squelch circuit 3c at the time of the test operation of the squelch circuit 3c in the semiconductor integrated circuit 100 shown in FIG. 1.
Figure 5:
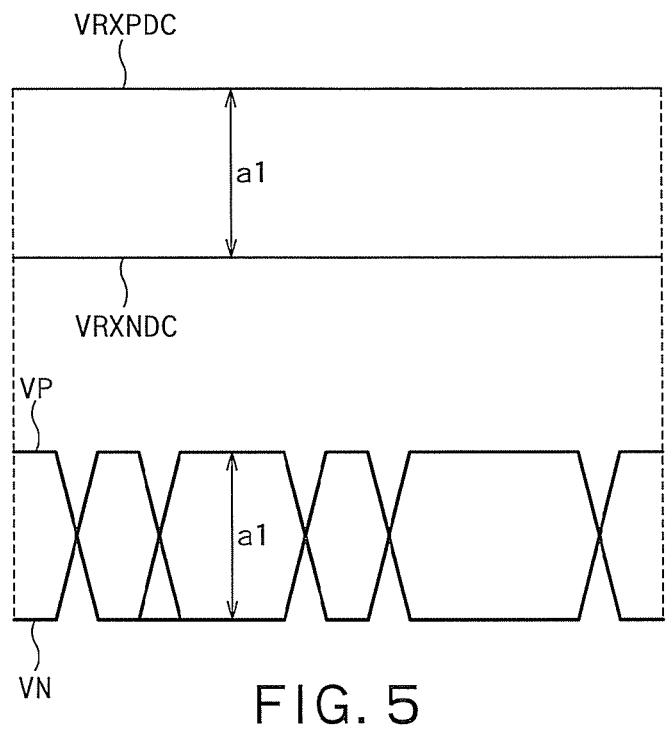
FIG. 5 is a diagram showing an example of waveforms of the DC voltages VRXPDC and VRXNDC applied to the first and second reception terminals 1 and 2 at the time of the test operation and waveforms of voltages VP and VN which are input respectively to the noninverting input terminal 3c1 and the inverting input terminal 3c2 of the squelch circuit 3c.
Figure 6:
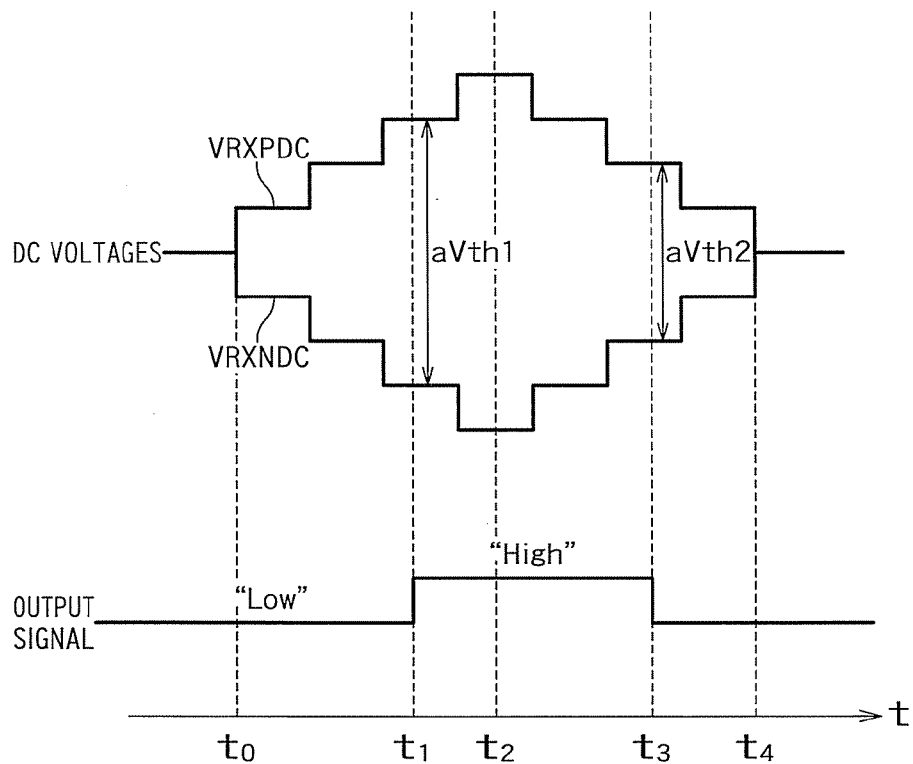
FIG. 6 is a diagram showing an example of relations between the DC voltages VRXPDC and VRXNDC applied to the first and second reception terminals 1 and 2 and the output signal of the squelch circuit 3c at the time of the test operation.

FIG. 2 is a flow chart showing an example of the test operation of the squelch circuit 3c in the semiconductor integrated circuit 100 shown in FIG. 1. FIG. 3 and FIG. 4 are diagrams showing connection relations in the switch device 10 and paths of voltages which are input to the squelch circuit 3c at the time of the test operation of the squelch circuit 3c in the semiconductor integrated circuit 100 shown in FIG. 1. Out of the configuration of the semiconductor integrated circuit 100, the first and second reception terminals 1 and 2, the squelch circuit 3c and the switch device 10 are shown in FIGS. 3 and 4. FIG. 5 is a diagram showing an example of waveforms of the DC voltages VRXPDC and VRXNDC applied to the first and second reception terminals 1 and 2 at the time of the test operation and waveforms of voltages VP and VN which are input respectively to the noninverting input terminal 3c1 and the inverting input terminal 3c2 of the squelch circuit 3c. FIG. 6 is a diagram showing an example of relations between the DC voltages VRXPDC and VRXNDC applied to the first and second reception terminals 1 and 2 and the output signal of the squelch circuit 3c at the time of the test operation.

In FIG. 2, the test operation of the squelch circuit 3c is started. First, at step S1, the switch circuits 10a to 10d in the switch device 10 are set into a state in which they can be controlled according to the differential signals VTXP and VTXN. For example, if the switch circuits 10a to 10d are formed of MOS transistors, a state in which the differential signals VTXP and VTXN are input to gates of the MOS transistors is brought about.

Then, the multiplexer 8 outputs the test pattern signal generated by the pattern generator 9. And the driver 7a outputs the differential signals VTXP and VTXN on the basis of the test pattern signal subjected to the parallel-serial conversion. Accordingly, the differential signals VTXP and VTXN are input to the switch circuits 10a to 10d (step S2).

As a result, the semiconductor integrated circuit 100 makes a transition between a connection state (FIG. 3) in which the first and second switch circuits 10a and 10b are in the on-state and the third and fourth switch circuits 10c and 10d are in the off-state, and a connection state (FIG. 4) in which the first and second switch circuits 10a and 10b are in the off-state and the third and fourth switch circuits 10c and 10d are in the on-state.

Then, the preset first and second DC voltages VRXPDC and VRXNDC are applied to the first and second reception terminals 1 and 2 by a tester 20 conducting a DC test which is a low speed test (step S3).

For example, as shown in FIG. 5, the voltages VP and VN which are input to the noninverting input terminal 3c1 and the inverting input terminal 3c2 of the squelch circuit 3c become pattern signals which have the same amplitude a1 as that of the DC voltages VRXPDC and VRXNDC and which are synchronized to the differential signals VTXP and VTXN.

In a state in which the first DC voltage VRXPDC is applied to the first reception terminal 1 and the second DC voltage VRXNDC is applied to the second reception terminal 2, therefore, the semiconductor integrated circuit 100 controls the first and second switch circuits 10a and 10b to be synchronous in on/off and controls the third and fourth switch circuits 10*c* and 10*d* to be synchronous in on/off and be complementary in on/off to the first and second switch circuits 10*a* and 10*b*.

Then, the squelch circuit 3*c* detects the amplitude (potential difference) of the differential signal which is input via the first noninverting input terminal 3*c*1 and the first inverting input terminal 3*c*2. If the detected amplitude is at least the prescribed threshold, the squelch circuit 3*c* outputs a signal of, for example, a "high" level. On the other hand, if the detected amplitude is less than the prescribed threshold, the squelch circuit 3*c* outputs a signal of, for example, a "low" level.

And, for example, the internal circuit 4 determines whether the output signal of the squelch circuit 3*c* is the "high" level or the "low" level (step S4). By the way, the tester 20 or an external circuit (not illustrated) may make the determination as to the output of the squelch circuit 3*c*.

If it is judged at step S5 that a potential difference between the first and second DC voltages VRXPDC and VRXNDC applied from the tester 20 respectively to the first and second reception terminals 1 and 2 has not reached a predetermined potential difference, the potential difference between the first and second DC voltages VRXPDC and VRXNDC applied from the tester 20 respectively to the first and second reception terminals 1 and 2 is set to be changed (raised or lowered) (step S6). And the processing returns to the step S3, and the preset first and second DC voltages VRXPDC and VRXNDC are applied from the tester 20 respectively to the first and second reception terminals 1 and 2.

The flow ranging from the step S3 to the step S6 is repeated in this way. Thereby, the tester 20 changes the potential difference between the first DC voltage VRXPDC and the second DC voltage VRXNDC step by step (in a section between time t0 and time t2 and a section between time t2 and t4 shown in FIG. 6). While the potential difference is changed step by step, the relation representing which of the potential difference and the threshold of the squelch circuit 3*c* is greater changes (at time t1 and time t3 in FIG. 6). As a result, the level of the output signal of the squelch circuit 3*c* changes.

On the other hand, if it is judged at the step S5 that a potential difference a1 between the first and second DC voltages VRXPDC and VRXNDC applied respectively to the first and second reception terminals 1 and 2 has reached a predetermined potential difference (at the time t2 and the time t4 in FIG. 6), then, for example, the tester 20 acquires the potential difference a1 (aVth1 and aVth2 in FIG. 6) at the time when the output signal level of the squelch circuit 3*c* has changed (step S7).

The potential difference a1 is acquired as a value corresponding to the threshold of the squelch circuit, and the test operation on the squelch circuit 3*c* is completed.

In this way, the threshold of the squelch circuit 3*c* is judged on the basis of the signal which is output from the squelch circuit 3*c*, at the time of the test operation. For example, it is determined whether the semiconductor integrated circuit 100 satisfies the specifications on the basis of the judged threshold.

Owing to the flow described heretofore, a high speed test (a test at an operation transfer rate) of the squelch circuit 3*c* in the semiconductor integrated circuit 100 can be conducted by using high precision DC voltages supplied from a low speed tester.

At the time of the ordinary operation in which the differential signal is received from the first and second reception terminals 1 and 2, the first switch circuit 10*a* and the second switch circuit 10*b* are tuned on and the third switch circuit 10*c* and the fourth switch circuit 10*d* are turned off as already described.

Therefore, the signal which is input to the first reception terminal 1 is input to the noninverting input terminal of the receiver 3*a* and the noninverting input terminal of the squelch circuit 3*c*, and the signal which is input to the second reception terminal 2 is input to the inverting input terminal of the receiver 3*a* and the inverting input terminal of the squelch circuit 3*c*, at the time of the ordinary operation. In other words, the reception circuit 3 conducts an operation which is similar to that of the conventional reception circuit, at the time of the ordinary operation.

According to the semiconductor integrated circuit in the present embodiment, the high speed test of the squelch circuit can be conducted by using the high precision DC voltages supplied from the low speed tester owing to the provision of the switch device as described heretofore.

Furthermore, since the number of added circuit elements such as the switching device and the pattern generator is small, the increase of the circuit area can also be suppressed.

In addition, except the switch circuit, the circuit and signal used in the ordinary loop back test (a test in which a test pattern signal supplied from a pattern generator is input to a receiver circuit on a reception line side via a serializer or the like on a transmission line side) can be used as they are.

Further, high speed tests of the squelch circuit with various test patterns become possible by changing the test pattern signal which is output by the pattern generator.

(Second Embodiment)

In the first embodiment, the example in which the squelch circuit is tested by applying DC voltages supplied from the tester to the reception terminals has been described.

On the other hand, in the present second embodiment, an example in which the squelch circuit is tested by providing a test terminal for testing separately and applying a DC voltage from the tester to the test terminal will be described.

Figure 7:
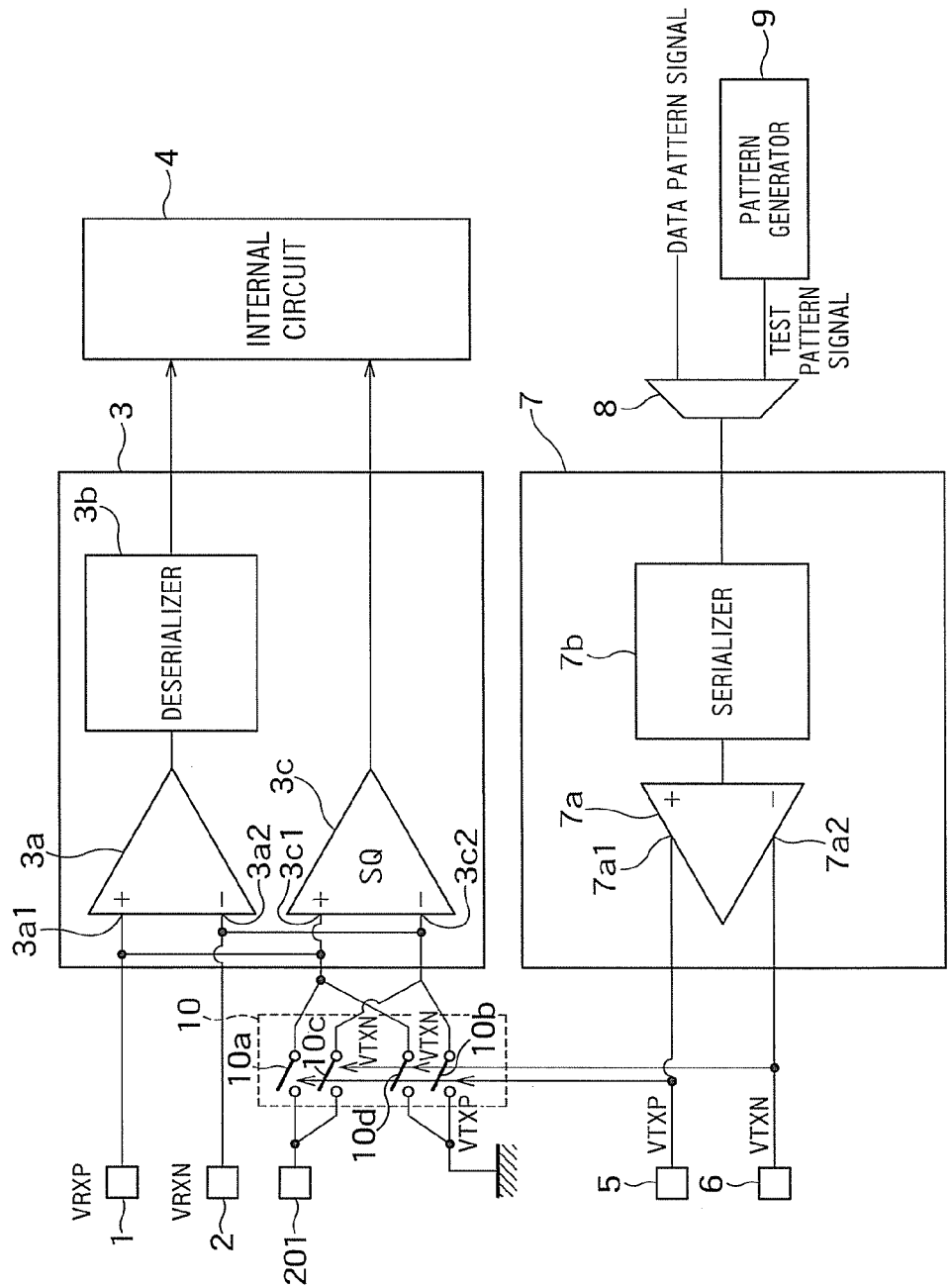
FIG. 7 is a diagram showing an example of a configuration of a semiconductor integrated circuit 200 according to the second embodiment which is an aspect of the present invention.

FIG. 7 is a diagram showing an example of a configuration of a semiconductor integrated circuit 200 according to the second embodiment which is an aspect of the present invention. In FIG. 7, the same characters as those in FIG. 1 denote like components in FIG. 1.

As shown in FIG. 7, the semiconductor integrated circuit 200 includes a first reception terminal 1, a second reception terminal 2, a reception circuit 3, an internal circuit 4, a first transmission terminal 5, a second transmission terminal 6, a transmission circuit 7, a multiplexer 8, a pattern generator 9, a switch device 10, and a test terminal 201. In other words, the semiconductor integrated circuit 200 differs from the semiconductor integrated circuit 100 in the first embodiment in that the test terminal 200 is provided separately.

In the same way as the first embodiment, the first reception terminal 1 is adapted to be supplied with a reception signal VRXP at the time of an ordinary operation. The second reception terminal 2 is adapted to be supplied with a reception signal VRXN which is obtained by inverting the reception signal VRXP in phase at the time of the ordinary operation. In this way, the first reception terminal 1 and the second reception terminal 2 are used to receive a differential signal at the time of the ordinary operation.

Unlike the first embodiment, a signal is not input to the first and second reception terminals 1 and 2 at the time of the test operation.

In the same way as the first embodiment, the reception circuit 3 includes a receiver (comparator) 3*a*, a deserializer 3*b*, and a squelch circuit 3*c*.

The test terminal 201 is adapted to be supplied with a DC voltage (for example, a power supply voltage) which differs from a ground voltage at the time of the test operation.

The squelch circuit 3c includes a first noninverting input terminal 3c1 connected to the first reception terminal 1 and a first inverting input terminal 3c2 connected to the second reception terminal, in the same way as the first embodiment. The squelch circuit 3c is adapted to compare differential amplitude between a signal which is input to the first noninverting input terminal 3c1 and a signal which is input to the first inverting input terminal 3c2 with a preset threshold, and output a signal depending upon a result of the comparison.

The squelch circuit 3c detects amplitude of the signal which is input via the first and second reception terminals 1 and 2 (the first noninverting input terminal 3c1 and the first inverting input terminal 3c2) in the same way as the first embodiment. If the detected amplitude is at least the prescribed threshold, the squelch circuit 3c outputs, for example, a signal of the "high" level. On the other hand, if the detected amplitude is less than the prescribed threshold, the squelch circuit 3c outputs, for example, a signal of the "low" level.

For example, the internal circuit 4 can determine whether the signal which is input via the first and second reception terminals 1 and 2 is a prescribed signal or noise on the basis of the output signal of the squelch circuit 3c. In this way, the squelch circuit 3c is used to detect whether a valid signal is sent from the transmission side.

The receiver 3a includes a second inverting input terminal 3a2 connected to the first inverting input terminal 3c2 of the squelch circuit 3c and a second noninverting input terminal 3a1 connected to the first noninverting input terminal 3c1 of the squelch circuit 3c, in the same way as the first embodiment. In other words, the second noninverting input terminal 3a1 of the receiver 3a is connected to the first reception terminal 1, and the second inverting input terminal 3a2 of the receiver 3a is connected to the second reception terminal 2.

The receiver 3a is adapted to output a signal depending upon the amplitude of the differential signals VRXP and VRXN which are input respectively to the second noninverting input terminal 3a1 and the second inverting input terminal 3a2, at the time of ordinary operation.

The switch device 10 includes a first switch circuit 10a, a second switch circuit 10b, a third switch circuit 10c, and a fourth switch circuit 10d in the same way as the first embodiment.

The first switch circuit 10a is connected between the test terminal 201 and the first noninverting input terminal 3c1. The first switch circuit 10a is adapted to bring about conduction between the test terminal 201 and the first noninverting input terminal 3c1 when it is switched to the on-state, and bring about insulation between the test terminal 201 and the first noninverting input terminal 3c1 when it is switched to the off-state.

The second switch circuit 10b is connected between the ground and the first inverting input terminal 3c2. The second switch circuit 10b is adapted to bring about conduction between the ground and the first inverting input terminal 3c2 when it is switched to the on-state, and bring about insulation between the ground and the first inverting input terminal 3c2 when it is switched to the off-state.

The third switch circuit 10c is connected between the test terminal 201 and the first inverting input terminal 3c2. The third switch circuit 10c is adapted to bring about conduction between the test terminal 201 and the first inverting input terminal 3c2 when it is switched to the on-state, and bring about insulation between the test terminal 201 and the first inverting input terminal 3c2 when it is switched to the off-state.

The fourth switch circuit 10d is connected between the ground and the first noninverting input terminal 3c1. The fourth switch circuit 10d is adapted to bring about conduction between the ground and the first noninverting input terminal 3c1 when it is switched to the on-state, and bring about insulation between the ground and the first noninverting input terminal 3c1 when it is switched to the off-state.

In this way, the switch device 10 is connected between the test terminal 201 and the ground and the squelch circuit 3c in the second embodiment, whereas the switch device 10 is connected between the first and second reception terminals 1 and 2 and the squelch circuit 3c in the first embodiment.

At the time of a test operation, the first and second switch circuits 10a and 10b are controlled to turn on/off on the basis of the first differential signal VTXP which is output from the noninverting output terminal 7a1, in the same way as the first embodiment. At the time of the test operation, the third and fourth switch circuits 10c and 10d are controlled to turn on/off on the basis of the second differential signal VTXN which is output from the inverting output terminal 7a2 and which has a phase inverted as compared with the first differential signal VTXP, in the same way as the first embodiment. In other words, the first to fourth switch circuits 10a to 10d are controlled to turn on/off on the basis of the test pattern signal generated by the pattern generator 9.

In this way, at the time of the test operation, the first switch circuit 10a and the second switch circuit 10b are controlled to be synchronized to each other in on/off (to turn on and off simultaneously) in the same way as the first embodiment. In addition, at the time of the test operation, the third switch circuit 10c and the fourth switch circuit 10d are controlled to be synchronized in on/off and be complementary in on/off (be opposite in on/off) to the first and second switch circuits 10a and 10b, in the same way as the first embodiment.

By the way, at the time of the test operation, a tester 20 is connected to the test terminal 201 as described later.

By the way, at the time of ordinary operation in which the differential signal is received from the first and second reception terminals 1 and 2, the first to fourth switches 10a to 10d are turned off.

Accordingly, at the time of the ordinary operation, the signal which is input to the first reception terminal 1 is input to the noninverting input terminal of the receiver 3a and the noninverting input terminal of the squelch circuit 3c, and the signal which is input to the second reception terminal 2 is input to the inverting input terminal of the receiver 3a and the inverting input terminal of the squelch circuit 3c. In other words, at the time of the ordinary operation, the reception circuit 3 conducts operation similar to that of the conventional reception circuit.

Remaining configuration of the semiconductor integrated circuit 200 is the same as that of the semiconductor integrated circuit 100 in the first embodiment.

Figure 8:
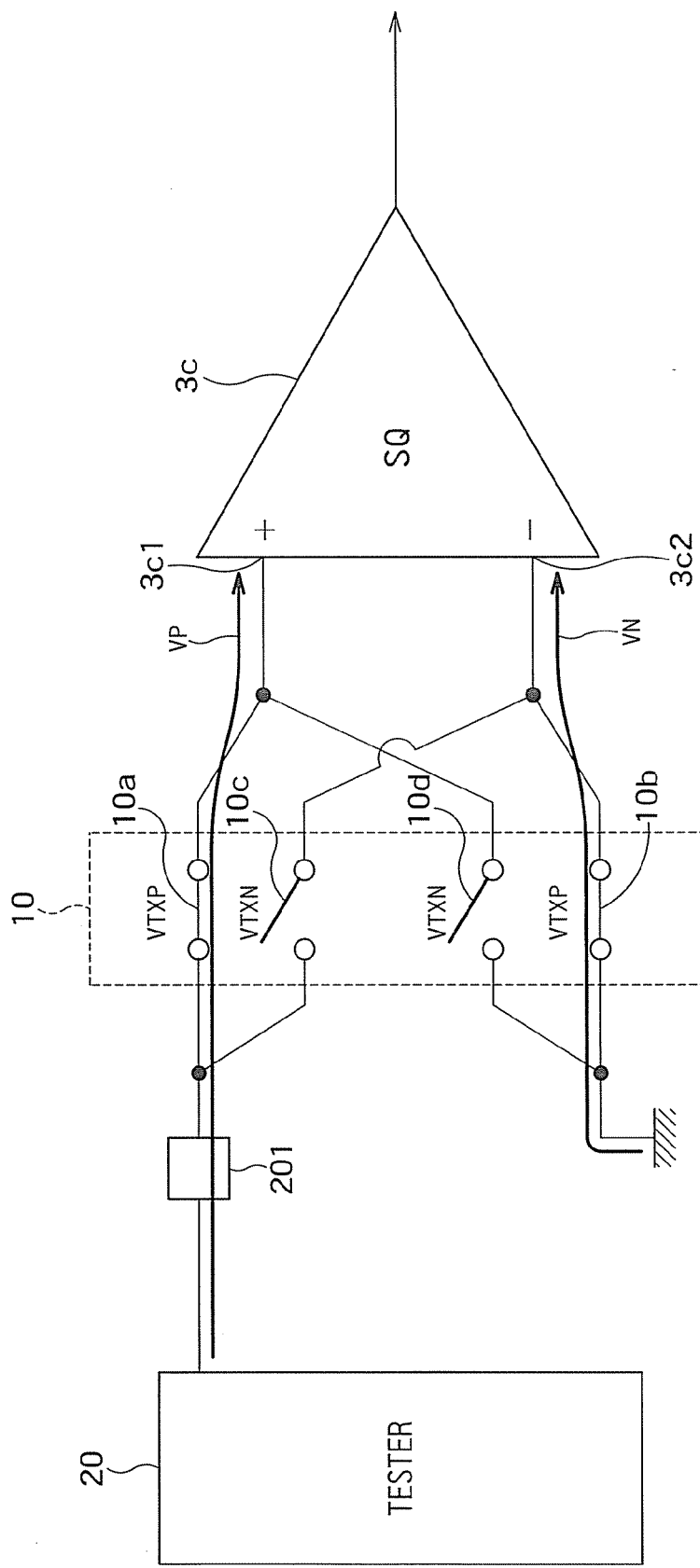
FIG. 8 is a diagram showing a connection relation in the switch device 10 and paths of voltages which are input to the squelch circuit 3c at the time of the test operation of the squelch circuit 3c in the semiconductor integrated circuit 200 shown in FIG. 7.
Figure 9:
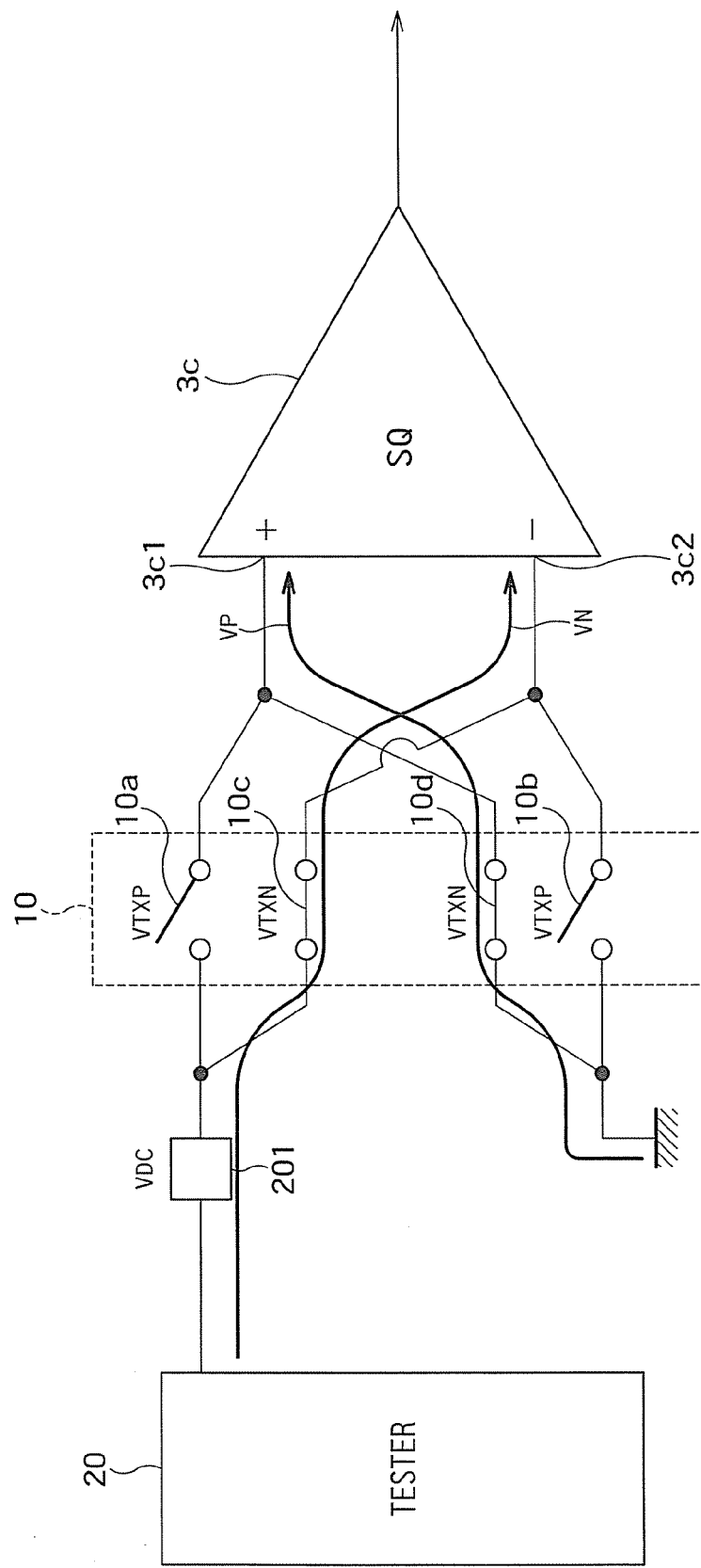
FIG. 9 is a diagram showing a connection relation in the switch device 10 and paths of voltages which are input to the squelch circuit 3c at the time of the test operation of the squelch circuit 3c in the semiconductor integrated circuit 200 shown in FIG. 7.

Test operation of the squelch circuit 3c in the semiconductor integrated circuit 200 having the configuration and function described heretofore is similar to that in the first embodiment. Hereafter, therefore, the test operation of the squelch circuit 3c in the semiconductor integrated circuit 200 will be described with reference to the flow chart shown in FIG. 2. Furthermore, FIG. 8 and FIG. 9 are diagrams showing connection relations in the switch device 10 and paths of voltages which are input to the squelch circuit 3c at the time of the test operation of the squelch circuit 3c in the semiconductor integrated circuit 200 shown in FIG. 7. Out of the configuration of the semiconductor integrated circuit 200, the test terminal 201, the squelch circuit 3c and the switch device 10 are shown in FIGS. 8 and 9.

The steps S1 and S2 shown in FIG. 2 are the same as those in the first embodiment.

Then, a preset DC voltage is applied to the test terminal 201 by a tester 20 conducting a DC test which is a low speed test (step S3).

In a state in which a power supply voltage VDD is applied to the test terminal 201, therefore, the semiconductor integrated circuit 200 controls the first and second switch circuits 10a and 10b to be synchronous in on/off and controls the third and fourth switch circuits 10c and 10d to be synchronous in on/off and be complementary in on/off to the first and second switch circuits 10a and 10b.

Then, the squelch circuit 3c detects the amplitude of the differential signal (potential difference between the DC voltage and the ground voltage) which is input via the first noninverting input terminal 3c1 and the first inverting input terminal 3c2. If the detected amplitude is at least the prescribed threshold, the squelch circuit 3c outputs a signal of, for example, a "high" level. On the other hand, if the detected amplitude is less than the prescribed threshold, the squelch circuit 3c outputs a signal of, for example, a "low" level.

And, for example, the internal circuit 4 determines whether the output signal of the squelch circuit 3c is the "high" level or the "low" level (step S4). By the way, the tester 20 or an external circuit (not illustrated) may make the determination as to the output of the squelch circuit 3c.

If it is judged at step S5 that a potential difference between the ground voltage and the DC voltage applied from the tester 20 to the test terminal 201 has not reached a predetermined potential difference, the potential difference between the DC voltage applied from the tester 20 to the test terminal 201 and the ground voltage is set to be changed (raised or lowered) (step S6). And the processing returns to the step S3, and the preset DC voltage is applied to the test terminal 201 by the tester 20.

The flow ranging from the step S3 to the step S6 is repeated in this way. Thereby, the tester 20 changes the potential difference between the DC voltage and the ground voltage step by step. While the potential difference is changed step by step, the relation representing which of the potential difference and the threshold of the squelch circuit 3c is greater changes. As a result, the level of the output signal of the squelch circuit 3c changes.

On the other hand, if it is judged at the step S5 that a potential difference between the DC voltage applied from the tester 20 to the test terminal 201 and the ground voltage has reached a predetermined potential difference, then, for example, the tester 20 acquires the potential difference at the time when the output signal level of the squelch circuit 3c has changed (step S7).

The potential difference is acquired as a value corresponding to the threshold of the squelch circuit, and the test operation on the squelch circuit 3c is completed.

In this way, the threshold of the squelch circuit 3c is judged on the basis of the signal which is output from the squelch circuit 3c, at the time of the test operation. For example, it is determined whether the semiconductor integrated circuit 200 satisfies the specifications on the basis of the judged threshold.

Owing to the flow described heretofore, a high speed test (a test at an operation transfer rate) of the squelch circuit 3c in the semiconductor integrated circuit 200 can be conducted by using high precision DC voltages supplied from a low speed tester.

At the time of the ordinary operation in which the differential signal is received from the first and second reception terminals 1 and 2, the first to fourth switch circuits 10a to 10d are turned off as already described.

Therefore, the signal which is input to the first reception terminal 1 is input to the noninverting input terminal of the receiver 3a and the noninverting input terminal of the squelch circuit 3c, and the signal which is input to the second reception terminal 2 is input to the inverting input terminal of the receiver 3a and the inverting input terminal of the squelch circuit 3c, at the time of the ordinary operation. In other words, the reception circuit 3 conducts an operation which is similar to that of the conventional reception circuit, at the time of the ordinary operation.

According to the semiconductor integrated circuit in the present embodiment, the high speed test of the squelch circuit can be conducted by using the high precision DC voltages supplied from the low speed tester owing to the provision of the switch device as described heretofore, in the same way as the first embodiment. Furthermore, since the number of added circuit elements such as the switching device and the pattern generator is small, the increase of the circuit area can also be suppressed.

By the way, in each of embodiments already described, on/off of the first to fourth switch circuits 10a to 10d may be controlled on the basis of the clock signal used in the semiconductor integrated circuit instead of the control based upon the test pattern which is output from the pattern generator 9. Also in the case where on/off of the first to fourth switch circuits 10a to 10d is controlled on the basis of the clock signal, a high speed test of the squelch circuit using the DC voltages supplied from the low speed tester is possible. Furthermore, in the case where the clock signal is used, it becomes unnecessary to provide the pattern generator 9 and the increase of the circuit area can be further suppressed.

In each of the embodiments already described, the test pattern from the pattern generator 9 is input to the switch device 10 via the serializer 7b and the driver 7a. Alternatively, however, the test pattern from the pattern generator 9 may be input to the switch device 10 without being passed through the serializer 7b and the driver 7a.

By the way, a circuit element which is not shown in FIG. 1 may be included between the first and second reception terminals 1 and 2 and the switch device 10 and between the switch device 10 and the squelch circuit 3c. In the same way, a circuit element which is not shown in FIG. 1 may be included between the pattern generator 9 and the serializer 7b, between the serializer 7b and the driver 7a, and between the driver 7a and the switch device 10.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a first reception terminal and a second reception terminal receiving a differential signal;
   a squelch circuit which has a first noninverting input terminal and a first inverting input terminal, which compares differential amplitude between a signal which is input to the first noninverting input terminal and a signal which is input to the first inverting input terminal with a preset threshold, and which outputs a signal depending upon a result of the comparison;

a first switch circuit which brings about conduction between the first reception terminal and the first noninverting input terminal when it is switched to an on-state, and which brings about insulation between the first reception terminal and the first noninverting input terminal when it is switched to an off-state;

a second switch circuit which brings about conduction between the second reception terminal and the first inverting input terminal when it is switched to an on-state, and which brings about insulation between the second reception terminal and the first inverting input terminal when it is switched to an off-state;

a third switch circuit which brings about conduction between the first reception terminal and the first inverting input terminal when it is switched to an on-state, and which brings about insulation between the first reception terminal and the first inverting input terminal when it is switched to an off-state;

a fourth switch circuit which brings about conduction between the second reception terminal and the first noninverting input terminal when it is switched to an on-state, and which brings about insulation between the second reception terminal and the first noninverting input terminal when it is switched to an off-state; and a pattern generator which is adapted to generate a test pattern signal, wherein at time of test operation of the squelch circuit, in a state in which a first DC voltage is applied to the first reception terminal and a second DC voltage which is different from the first DC voltage is applied to the second reception terminal, the first switch circuit and the second switch circuit are controlled to be synchronized to each other in on/off and the third switch circuit and the fourth switch circuit are controlled to be synchronized in on/off and be complementary in on/off to the first and second switch circuits, wherein on/off of the first to fourth switch circuits are controlled on the basis of the test pattern signal.

2. The semiconductor integrated circuit according to claim 1, further comprising:

a serializer which conducts parallel-to-serial conversion on the test pattern signal supplied from the pattern generator and outputs a resultant signal; and a driver which outputs the signal supplied from the serializer, as a differential signal, wherein on/off of the first to fourth switch circuits is controlled on the basis of the differential signal which is output from the driver.

3. The semiconductor integrated circuit according to claim 2, further comprising:

a receiver which includes a second inverting input terminal connected to the first inverting input terminal of the squelch circuit and a second noninverting input terminal connected to the first noninverting input terminal of the squelch circuit, and which outputs a signal depending upon amplitude of a differential signal input to the second inverting input terminal and the second noninverting input terminal; and a deserializer which conducts serial-parallel conversion on the signal output from the receiver and outputs a resultant signal.

4. The semiconductor integrated circuit according to claim 2, wherein the driver and the serializer make up a transmission circuit, an inverting output terminal of the driver being connected to the first transmission terminal, and a noninverting output terminal of the driver being connected to the second transmission terminal 6.

5. The semiconductor integrated circuit according to claim 4, further comprising a multiplexer to which the test pattern signal and a data pattern signal to be transmitted are input, the multiplexer being adapted to output either the test pattern signal or the data pattern signal, wherein the serializer is adapted to conduct parallel-serial conversion on a signal from the multiplexer and output a resultant signal to the driver.

6. The semiconductor integrated circuit according to claim 1, wherein the first DC voltage is constant and the second DC voltage is constant.

7. The semiconductor integrated circuit according to claim 1, wherein the first switch circuit is connected between the first reception terminal and the first noninverting input terminal, the second switch circuit is connected between the second reception terminal and the first inverting input terminal, the third switch circuit is connected between the first reception terminal and the first inverting input terminal, and the fourth switch circuit is connected between the second reception terminal and the first noninverting input terminal.

* * * * *